United States Patent
Du et al.

(10) Patent No.: US 12,167,621 B2
(45) Date of Patent: Dec. 10, 2024

(54) DISPLAY SUBSTRATE, METHOD OF MANUFACTURING THE SAME AND DISPLAY DEVICE

(71) Applicants: BEIJING BOE TECHNOLOGY DEVELOPMENT CO., LTD., Beijing (CN); CHENGDU BOE OPTOELECTRONICS TECHNOLOGY CO., LTD., Sichuan (CN)

(72) Inventors: Lili Du, Beijing (CN); Hongjun Zhou, Beijing (CN); Feng Wei, Beijing (CN)

(73) Assignees: Beijing BOE Technology Development Co., Ltd., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 397 days.

(21) Appl. No.: 17/595,306

(22) PCT Filed: Feb. 26, 2021

(86) PCT No.: PCT/CN2021/078084
§ 371 (c)(1),
(2) Date: Nov. 12, 2021

(87) PCT Pub. No.: WO2022/178809
PCT Pub. Date: Sep. 1, 2022

(65) Prior Publication Data
US 2023/0092961 A1    Mar. 23, 2023

(51) Int. Cl.
*H10K 50/84* (2023.01)
*H10K 59/131* (2023.01)
(Continued)

(52) U.S. Cl.
CPC .......... *H10K 50/84* (2023.02); *H10K 59/131* (2023.02); *H10K 71/00* (2023.02); *H10K 59/1201* (2023.02)

(58) Field of Classification Search
CPC ............................. H10K 59/131; H10K 50/84
(Continued)

(56) References Cited

U.S. PATENT DOCUMENTS 10,725,344 B1    7/2020  Wu
2013/0033839 A1  2/2013  Kasahara et al.
(Continued)

FOREIGN PATENT DOCUMENTS

CN    106057848 A    10/2016
CN    107342311 A    11/2017
(Continued)

OTHER PUBLICATIONS

European Patent Office, Extended European Search Report Issued in Application No. 21927247.3, May 26, 2023, Germany, 9 pages.

*Primary Examiner* — Christopher M Raabe
(74) *Attorney, Agent, or Firm* — McCoy Russell LLP

(57) ABSTRACT

The present disclosure provides a display substrate, a manufacturing method and a display device. The display substrate includes a display region, and a non-display region surrounding the display region and including an encapsulation adhesive region surrounding the display region. The display substrate further includes an encapsulation base layer arranged at the encapsulation adhesive region; and a fanout layer arranged at the non-display region and including a first reuse portion. An orthogonal projection of the first reuse portion onto a base substrate of the display substrate at least partially overlaps an orthogonal projection of a first target region of the encapsulation adhesive region onto the base (Continued)

substrate, and the first reuse portion is reused as the encapsulation base layer at the first target region.

19 Claims, 8 Drawing Sheets

(51) Int. Cl.
*H10K 71/00* (2023.01)
*H10K 59/12* (2023.01)

(58) Field of Classification Search
USPC ........................................................ 313/512
See application file for complete search history.

(56) References Cited

U.S. PATENT DOCUMENTS

| | | |
|---|---|---|
| 2015/0060789 A1 | 3/2015 | Cho et al. |
| 2016/0013441 A1 | 1/2016 | Hong |
| 2016/0293883 A1 | 10/2016 | Hong et al. |
| 2016/0343792 A1 | 11/2016 | Jang |
| 2016/0343980 A1 | 11/2016 | Lee et al. |
| 2017/0077192 A1 | 3/2017 | Jang |
| 2018/0337226 A1 | 11/2018 | Liu et al. |
| 2020/0175901 A1* | 6/2020 | Lee ........................ G09G 3/006 |
| 2022/0173178 A1* | 6/2022 | Kanehiro ............. H10K 59/122 |
| 2022/0236835 A1* | 7/2022 | Ito ......................... G06F 3/0448 |

FOREIGN PATENT DOCUMENTS

| | | |
|---|---|---|
| CN | 107565046 A | 1/2018 |
| CN | 107565057 A | 1/2018 |
| CN | 108493226 A | 9/2018 |
| CN | 111367125 A | 7/2020 |
| CN | 111430572 A | 7/2020 |
| CN | 112349759 A | 2/2021 |
| EP | 1814181 A2 | 8/2007 |
| EP | 3232489 A1 | 10/2017 |

* cited by examiner

DISPLAY SUBSTRATE, METHOD OF MANUFACTURING THE SAME AND DISPLAY DEVICE

CROSS REFERENCE TO RELATED APPLICATION

The present application is a U.S. National Phase of International Application No. PCT/CN2021/078084 entitled "DISPLAY SUBSTRATE, METHOD OF MANUFACTURING THE SAME AND DISPLAY DEVICE," and filed on Feb. 26, 2021. The entire contents of the above-listed application is hereby incorporated by reference for all purposes.

TECHNICAL FIELD

The present disclosure relates to the field of display technology, in particular to a display substrate, a method of manufacturing the same, and a display device.

BACKGROUND

In an Organic Light-Emitting Diode (OLED) element, a metal film layer and an organic functional layer are both sensitive to moisture and oxygen. When moisture and oxygen permeate into an interior of the element, the element is aged, its performance is deteriorated, and its service life is shorten significantly. In addition, when moisture and oxygen enter the element, an organic matter and a cathode in the element are oxidized, a light-emitting region of the element is shrunk, and even a non-light-emitting portion occurs in the light-emitting region. Hence, it is necessary to encapsulate the OLED element.

Currently, Thin Film Encapsulation (TFE) is usually adopted for encapsulating a flexible OLED element, and Frit is usually adopted for encapsulating a rigid OLED element.

SUMMARY

An object of the present disclosure is to provide a display substrate, a method of manufacturing the same and a display device, so as to solve the above-mentioned problems.

In order to achieve the above purpose, the present disclosure provides the following technical solutions.

In one aspect, the present disclosure provides in some embodiments a display substrate, including a display region, and a non-display region surrounding the display region and including an encapsulation adhesive region surrounding the display region. The display substrate further includes: an encapsulation base layer arranged at the encapsulation adhesive region; and a fanout layer arranged at the non-display region and including a first reuse portion. An orthogonal projection of the first reuse portion onto a base substrate of the display substrate at least partially overlaps an orthogonal projection of a first target region of the encapsulation adhesive region onto the base substrate, and the first reuse portion is reused as the encapsulation base layer at the first target region.

In a possible embodiment of the present disclosure, the display substrate further includes a first via-hole structure arranged at the first target region, so that a surface of a part of the display substrate at the first target region away from the base substrate is uneven.

In a possible embodiment of the present disclosure, the display substrate further includes at least two of a first gate insulation layer, a second gate insulation layer and an interlayer dielectric layer laminated one on another on the base substrate in a direction away from the base substrate. The first via-hole structure includes a plurality of first via-holes, and the first via-hole penetrates through at least one of the first gate insulation layer, the second gate insulation layer and the interlayer dielectric layer.

In a possible embodiment of the present disclosure, the fanout layer includes a plurality of fanout lines, the plurality of fanout lines includes the first reuse portion, and an orthogonal projection of the fanout line onto the base substrate does not overlap an orthogonal projection of the first via-hole structure onto the base substrate.

In a possible embodiment of the present disclosure, the plurality of first via-holes is divided into a plurality of via-hole groups, and orthogonal projections of the plurality of via-hole groups onto the base substrate and orthogonal projections of the plurality of fanout lines onto the base substrate are arranged alternately in a first direction.

In a possible embodiment of the present disclosure, the plurality of fanout lines is arranged between the first gate insulation layer and the interlayer dielectric layer.

In a possible embodiment of the present disclosure, the plurality of fanout lines includes a plurality of first fanout lines and a plurality of second fanout lines, the plurality of first fanout lines is arranged between the first gate insulation layer and the second gate insulation layer, the plurality of second fanout lines is arranged between the second gate insulation layer and the interlayer dielectric layer, and each of the plurality of first fanout lines and the plurality of second fanout lines includes the first reuse portion.

In a possible embodiment of the present disclosure, at least a part of the encapsulation base layer is arranged between the first gate insulation layer and the second gate insulation layer.

In a possible embodiment of the present disclosure, the display substrate further includes a first power source line and a second power source line arranged at the non-display region. The first power source line includes a transmission portion and two first line inlet portions, the transmission portion extends in a first direction, at least a part of the second line inlet portion extends in a second direction, two ends of the transmission portion are coupled to the two first line inlet portions respectively, the transmission portion is arranged between the display region and the first line inlet portion, and the first direction intersects the second direction. The second power source line includes a peripheral portion and two second line inlet portions, the peripheral portion surrounds the display region and is provided with an opening, two ends of the peripheral portion at the opening are coupled to the two second line inlet portions respectively, and at least a part of each second line inlet portion extends in the second direction. An orthogonal projection of each of two first line inlet portion onto the base substrate is located between orthogonal projections of the two second line inlet portions onto the base substrate.

In a possible embodiment of the present disclosure, the non-display region includes two corner regions arranged in the first direction and corresponding to the two second line inlet portions respectively, and at least a part of the second line inlet portion is arranged at a corresponding corner region.

In a possible embodiment of the present disclosure, each first line inlet portion includes a second reuse portion, an orthogonal projection of the second reuse portion onto the base substrate at least partially overlaps an orthogonal projection of a second target region of the encapsulation adhesive region onto the base substrate, and the second reuse portion is reused as the encapsulation base layer at the second target region.

In a possible embodiment of the present disclosure, each second line inlet portion includes a third reuse portion, an orthogonal projection of the third reuse portion onto the base substrate at least partially overlaps an orthogonal projection of a third target region of the encapsulation adhesive region onto the base substrate, and the third reuse portion is reused as the encapsulation base layer at the third target region.

In a possible embodiment of the present disclosure, a plurality of second via-holes is formed in the second reuse portion and/or the third reuse portion.

In a possible embodiment of the present disclosure, the display substrate further includes: a gate driving circuit arranged at two opposite sides of the display region in the first direction; and a plurality of first signal lines arranged at a same side of the display region as the first power source line, coupled to the gate driving circuit, and configured to provide a corresponding signal to the gate driving circuit. The first signal line includes a fourth reuse portion, an orthogonal projection of the fourth reuse portion onto the base substrate at least partially overlaps an orthogonal projection of a fourth target region of the encapsulation adhesive region onto the base substrate, and the fourth reuse portion is reused as the encapsulation base layer at the fourth target region.

In a possible embodiment of the present disclosure, the encapsulation base layer includes: at least two first encapsulation portions, an orthogonal projection of the at least two first encapsulation portions onto the base substrate being arranged between orthogonal projections of the two first line inlet portions onto the base substrate, the at least two first encapsulation portions being arranged in the first direction, the first target region being provided between the adjacent first encapsulation portions; and a circular encapsulation portion surrounding a side of the display region other than another side where the first encapsulation portion is located.

In a possible embodiment of the present disclosure, the first encapsulation portion is coupled to the first power source line, and the circular encapsulation portion is coupled to the second power source line.

In a possible embodiment of the present disclosure, the encapsulation base layer further includes a plurality of first conductive connection portions formed integrally with the first encapsulation portion, and the first encapsulation portion is coupled to the transmission portion through the plurality of first conductive connection portions.

In a possible embodiment of the present disclosure, the encapsulation base layer further includes a plurality of second conductive connection portions formed integrally with the circular encapsulation portion, a plurality of protrusions is arranged at an edge of the peripheral portion and/or the second line inlet portion, and the circular encapsulation portion is coupled to at least a part of the protrusions through the plurality of second conductive connection portions.

In a possible embodiment of the present disclosure, a plurality of third via-holes is formed in the first encapsulation portion and/or the circular encapsulation portion, the display substrate further includes a plurality of groups of third secondary via-hole corresponding to the plurality of third via-holes in a one-to-one manner, each group of third secondary via-holes include a plurality of third secondary via-holes, an orthogonal projection of the plurality of third secondary via-holes onto the base substrate is located within an orthogonal projection of a corresponding third via-hole onto the base substrate, and the third secondary via-hole penetrates through at least one of the interlayer dielectric layer, the second gate insulation layer and the first gate insulation layer.

In a possible embodiment of the present disclosure, the first via-hole has an aperture size smaller than that of the third via-hole.

In a possible embodiment of the present disclosure, the display substrate includes a first gate insulation layer, a second gate insulation layer and an interlayer dielectric layer laminated one on another on the base substrate in a direction away from the base substrate, and the third secondary via-hole penetrates through the interlayer dielectric layer, the second gate insulation layer and the first gate insulation layer.

In another aspect, the present disclosure provides in some embodiments a display device including the above-mentioned display substrate.

In a possible embodiment of the present disclosure, the display device further includes an encapsulation cover plate arranged opposite to the display substrate, and the encapsulation cover plate and the display substrate are sealed through a sealant at the encapsulation adhesive region.

In yet another aspect, the present disclosure provides in some embodiments a method for manufacturing a display substrate, the display substrate including a display region, and a non-display region surrounding the display region and including an encapsulation adhesive region surrounding the display region, the method including: forming an encapsulation base layer at the encapsulation adhesive region; and forming a fanout layer at the non-display region, the fanout layer including a first reuse portion. An orthogonal projection of the first reuse portion onto a base substrate of the display substrate at least partially overlaps an orthogonal projection of a first target region of the encapsulation adhesive region onto the base substrate, and the first reuse portion is reused as the encapsulation base layer at the first target region.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
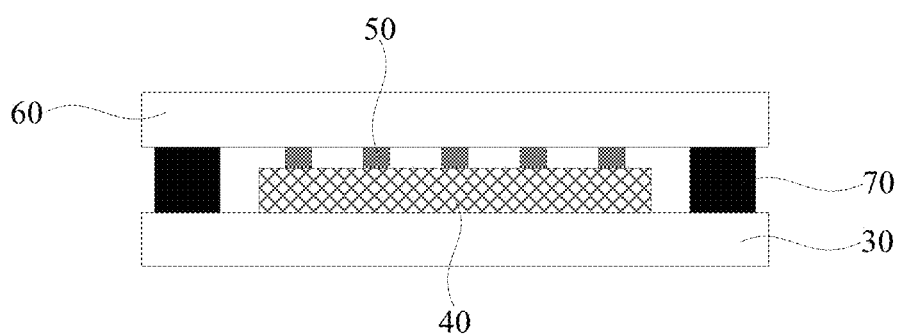
FIG. 1 is a schematic view showing an encapsulation structure for a display substrate according to one embodiment of the present disclosure.

As shown in FIG. 1, the present disclosure provides in some embodiments a display panel, which includes a base substrate 30, an OLED element 40 arranged on the base substrate 30, a plurality of spacers 50 arranged on the OLED element 40, and a cover plate 60 arranged at a side of the plurality of spacers 50 away from the base substrate 30. The cover plate 60 is adhered to the base substrate 30 through a frit adhesive 70, so as to encapsulate the OLED element.

According to the display panel in the embodiments of the present disclosure, the encapsulation is performed through a frit encapsulation process, so it is able to simplify the encapsulation process, and ensure the luminous efficiency of the display panel in the case of a top-emission structure.

However, during the encapsulation, there is still room for improvement in a curing effect of the frit adhesive as well as adhesion of the frit adhesive with the base substrate.

Referring to FIGS. 2, 4, 6, 8, 9, 14 and 16, the present disclosure provides in some embodiments a display substrate, which includes a display region 1, and a non-display region 2 surrounding the display region 1 and including an encapsulation adhesive region 20 surrounding the display region 1. The display substrate further includes: an encapsulation base layer arranged at the encapsulation adhesive region 20; and a fanout layer 22 arranged at the non-display region 2 and including a first reuse portion 220. An orthogonal projection of the first reuse portion 220 onto a base substrate of the display substrate at least partially overlaps an orthogonal projection of a first target region of the encapsulation adhesive region 20 onto the base substrate, and the first reuse portion 220 is reused as the encapsulation base layer at the first target region.

Illustratively, the display substrate includes the display region 1 and the non-display region 2, the display region 1 is of a circular or rectangular shape, and the non-display region 2 completely surrounds the display region 1.

Illustratively, the encapsulation base layer includes a metal layer with excellent reflection performance. The encapsulation base layer includes a first gate metal layer with excellent reflection performance, as well as a part of a first gate insulation layer, a part of a second gate insulation layer and a part of an interlayer dielectric layer of the display substrate. The encapsulation base layer surrounds the display region 1. The encapsulation base layer is arranged at a peripheral region of the non-display region 2 away from the display region 1, so as to surround the other functional structures at the non-display region 2 after the encapsulation.

Illustratively, the fanout layer 22 is arranged at a lower frame of the display substrate. The display substrate further includes a driving integrated circuit arranged at the non-display region 2, and the fanout layer 22 is coupled to a part of functional layers at the display region 1 and the driving integrated circuit, so as to achieve signal transmission between the part of functional layers and the driving integrated circuit.

Illustratively, the encapsulation adhesive region 20 includes the first target region, and the orthogonal projection of the first reuse portion 220 onto the base substrate of the display substrate is located within the orthogonal projection of the first target region of the encapsulation adhesive region 20 onto the base substrate. The first reuse portion 220 is reused as the encapsulation base layer at the first target region, i.e., it is unnecessary to provide a dedicated encapsulation base layer at the first target region.

Based on the above-mentioned specific structure of the display substrate, the encapsulation base layer is arranged at the encapsulation adhesive layer 20, so as to improve a curing effect of a frit adhesive during the encapsulation of the display substrate. In addition, the first reuse portion 220 is reused as the encapsulation base layer at the first target region, so as to prevent the formation of a large-size encapsulation base layer, thereby to reduce the manufacture cost of the display substrate.

In addition, a segment difference occurs due to a configuration of the fanout layer itself, and a part of a surface of the display substrate away from the base substrate is uneven at the first target region. In this way, when frit encapsulation is adopted for the display substrate, it is able to effectively increase a contact area between the frit adhesive and the display substrate, and improve the adhesion performance between the frit adhesive and the display substrate, thereby to improve an encapsulation capability, improve a resistance to moisture and oxygen, and achieve a better sealing effect.

In some embodiments of the present disclosure, the display substrate further includes a first via-hole structure 23 arranged at the first target region, so that a surface of a part of the display substrate at the first target region away from the base substrate is uneven.

Illustratively, the first via-hole structure 23 includes a plurality of first via-holes 230 independent of each other and arranged at the first target region. The first via-hole 230 penetrates through at least a part of insulation layers at the first target region, so that the surface of a part of the display substrate at the first target region away from the base substrate is uneven.

Figure 10:
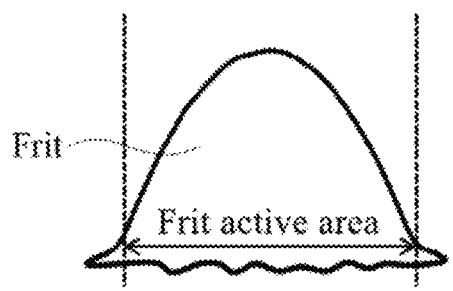
FIG. 10 is a sectional view of a frit encapsulation portion in the related art.
Figure 11:
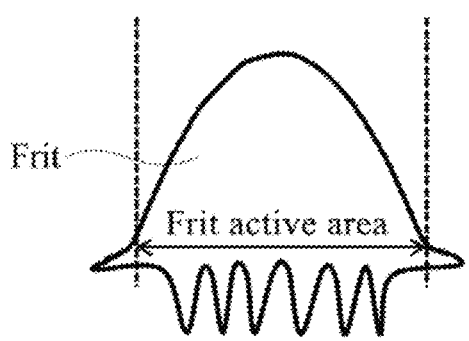
FIG. 11 is a sectional view of a frit encapsulation portion according to one embodiment of the present disclosure.

As shown in FIGS. 10 and 11, through the first via-hole structure 23 at the first target region, the surface of a part of the display substrate at the first target region away from the base substrate is uneven. In this way, when the frit encapsulation is adopted for the display substrate, it is able to effectively increase the contact area between the frit adhesive and the display substrate, and improve the adhesion performance between the frit adhesive and the display substrate, thereby to improve the encapsulation capability, improve the resistance to moisture and oxygen, and achieve a better sealing effect.

As shown in FIGS. 4, 6, 8 and 9, in some embodiments of the present disclosure, the display substrate further includes at least two of a first gate insulation layer GI1, a second gate insulation layer GI2 and an interlayer dielectric layer ILD laminated one on another in a direction away from the base substrate.

The first via-hole structure 23 includes a plurality of first via-holes 230, and the first via-hole 230 penetrates through at least one of the first gate insulation layer GI1, the second gate insulation layer GI2 and the interlayer dielectric layer ILD.

Illustratively, the display substrate includes a buffer layer 80, an active layer, the first gate insulation layer GI1, a first gate metal layer, the second gate insulation layer GI2, a second gate metal layer, the interlayer dielectric layer ILD, a first source-drain metal layer, a planarization layer, an anode layer, a light-emitting functional layer and a cathode layer laminated one on another in the direction away from the base substrate. The display substrate further includes an interlayer dielectric layer ILD arranged between the first source-drain metal layer and the planarization layer and a second source-drain metal layer arranged between the interlayer dielectric layer ILD and the planarization layer.

Illustratively, the display substrate includes a subpixel driving circuit, the subpixel driving circuit includes a transistor and a capacitor, the active layer is used to form an active pattern in the transistor, the first gate metal layer is used to form a gate electrode of the transistor and an electrode plate of the capacitor, the second gate metal layer is used to form another electrode plate of the capacitor, and the first source-drain metal layer is used to form a data line and some conductive connection members.

Illustratively, the display substrate includes a buffer layer 80, an active layer, the first gate insulation layer GI1, a first gate metal layer, the interlayer dielectric layer ILD, a first source-drain metal layer, a planarization layer, an anode layer, a light-emitting function layer, and a cathode layer laminated one on another in the direction away from the base substrate. The display substrate further includes an interlayer dielectric layer ILD arranged between the first source-drain metal layer and the planarization layer and a second source-drain metal layer arranged between the interlayer dielectric layer ILD and the planarization layer. It should be appreciated that, in this case, the display substrate does not include the second gate metal layer and the second gate insulation layer GI2.

Illustratively, the plurality of first via-holes 230 is arranged evenly at the first target region.

Illustratively, the first via-hole 230 merely penetrates through the interlayer dielectric layer ILD, and an orthogonal projection of the first via-hole 230 onto the base substrate overlaps, or does not overlap, an orthogonal projection of the fanout layer 22 onto the base substrate. Illustratively, each first via-hole 230 penetrates through the interlayer dielectric layer ILD and the second gate insulation layer GI2, and the orthogonal projection of the first via-hole 230 onto the base substrate does not overlap the orthogonal projection of the fanout layer 22 onto the base substrate. Illustratively, the first via-hole 230 penetrates through the interlayer dielectric layer ILD, the second gate insulation layer GI2 and the first gate insulation layer GI1, and the orthogonal projection of each first via-hole 230 onto the base substrate does not overlap the orthogonal projection of the fanout layer 22 onto the base substrate.

Illustratively, a size of the first via-hole 230 is 6 μm*6 μm, and each of a length and a width of the first via-hole 230 is within 1 μm to 10 μm, with end points being included.

When the first via-hole structure 23 includes the plurality of first via-holes 230, a depression depth of the surface of the part of the display substrate at the first target region away from the base substrate depends on a depth of the first via-hole 230. The larger the depression depth is, the larger the contact area between the frit adhesive and the display substrate during the encapsulation is, and the larger the adhesion performance between the frit adhesive and the display substrate is.

As shown in FIGS. 2-6, 8 and 9, in some embodiments of the present disclosure, the fanout layer 22 includes a plurality of fanout lines 221, the plurality of fanout lines 221 includes the first reuse portion 220, and an orthogonal projection of the fanout line 221 onto the base substrate does not overlap an orthogonal projection of the first via-hole structure 23 onto the base substrate.

Illustratively, the display substrate includes a plurality of gate lines and a plurality of data lines, each gate line extends in a first direction, each data line extends in a second direction intersecting the first direction, and at least a part of each gate line and at least a part of each data line are arranged at the display region.

Illustratively, the fanout layer 22 includes the plurality of fanout lines 221, and the fanout line 221 is coupled to a corresponding data line, so as to transmit a data signal to the data line.

Illustratively, each fanout line 221 includes a first segment and a second segment coupled to each other, and the second segment is arranged between the display region 1 and the first segment and coupled to a corresponding data line. The first segment extends in the second direction and includes a portion extending in a third direction, and the third direction intersects the first direction and the second direction. The second segments of the plurality of fanout lines 221 form a fan-like structure.

Illustratively, the first segment of each fanout line 221 includes the first reuse portion 220.

It should be appreciated that, a line width of each fanout line 221 and a distance between the adjacent fanout lines 221 are set according to the practical process requirement.

When the orthogonal projection of the fanout line 221 onto the base substrate does not overlap the orthogonal projection of the first via-hole structure 23 onto the base substrate, it is able to prevent the fanout line 221 from being damaged during the formation of the first via-hole structure 23, thereby to ensure the reliability of the display substrate in a better manner.

Figure 4:
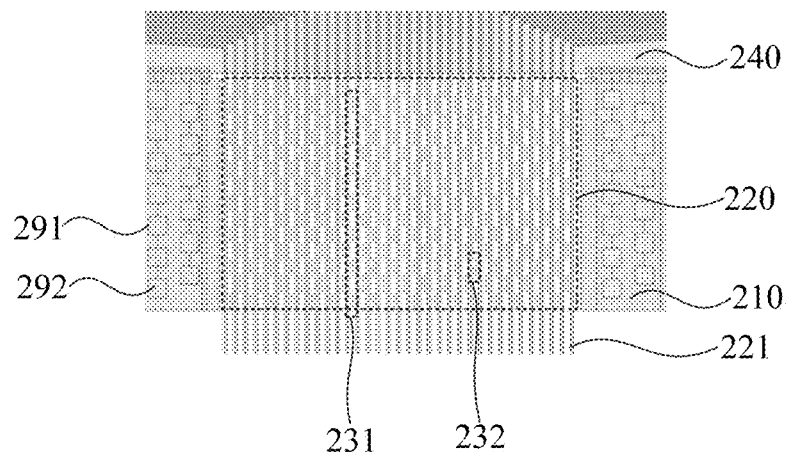
FIG. 4 is an enlarged view of A in FIG. 3.
Figure 5:
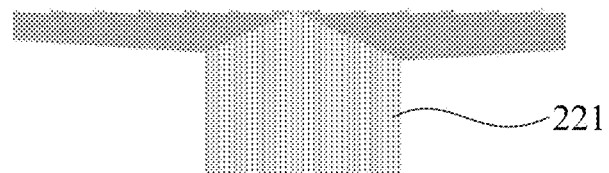
FIG. 5 is a schematic view showing fanout lines in proximity to A in FIG. 3.
Figure 6:
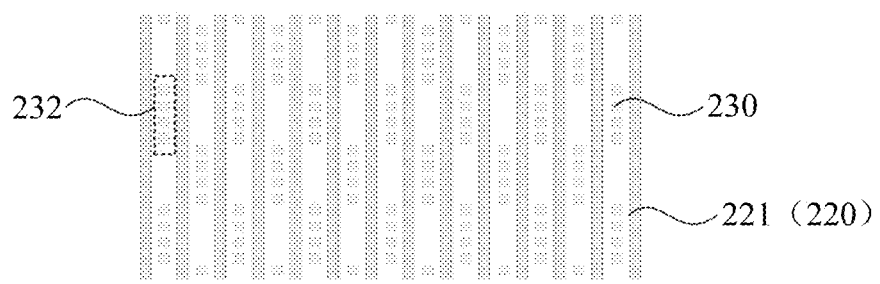
FIG. 6 is a schematic view showing the distribution of first reuse portions and first via-holes according to one embodiment of the present disclosure.
Figure 7:
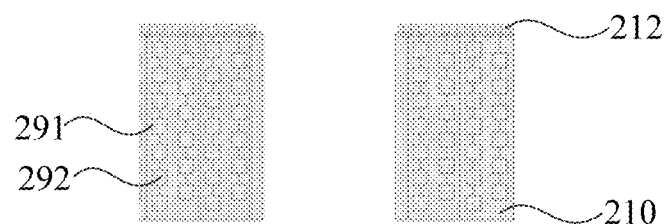
FIG. 7 is a schematic view showing a first encapsulation portion in FIG. 4.

As shown in FIG. 4, in some embodiments of the present disclosure, the plurality of first via-holes 230 is divided into a plurality of via-hole groups 231, and orthogonal projections of the via-hole groups onto the base substrate and orthogonal projections of the fanout lines 221 onto the base substrate are arranged alternately in the first direction.

Illustratively, the plurality of first via-holes 230 is divided into the plurality of via-hole groups 231, and each via-hole group 231 includes a plurality of first via-holes 230 arranged in the second direction.

Illustratively, the via-hole group 231 is divided into a plurality of secondary via-hole groups 232 arranged in the second direction, each secondary via-hole group 232 includes at least two first via-holes 230, and the secondary via-hole groups 232 at two sides of a same fanout line 221 are arranged in a staggered manner in the first direction. In one secondary via-hole group 232, a minimum distance between the adjacent first via-holes 230 in the second direction is smaller than a minimum distance between the adjacent two secondary via-hole groups 232 in the second direction.

When the orthogonal projections of the via-hole groups onto the base substrate and the orthogonal projections of the fanout lines 221 onto the base substrate are arranged alternately in the first direction, the first via-hole structure 23 is arranged in a gap between the fanout lines 221, and the first via-holes 230 are evenly distributed at the first target region. As a result, it is able to improve the adhesion performance of the frit adhesive at the entire first target region.

Figure 8:
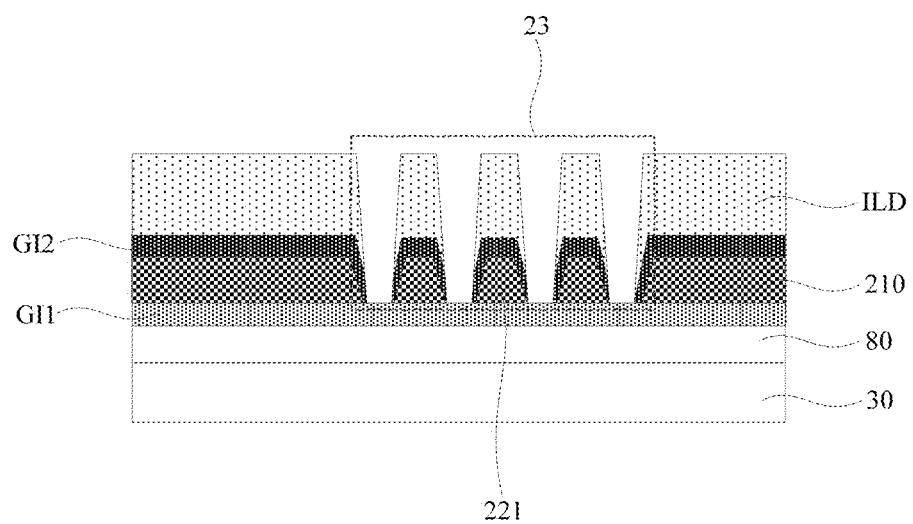
FIG. 8 is a sectional view of a first via-hole structure according to one embodiment of the present disclosure.
Figure 9:
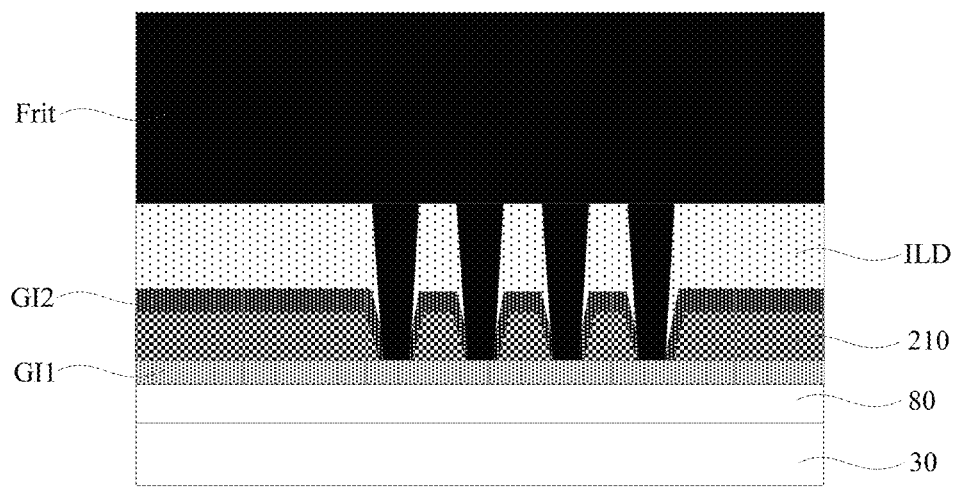
FIG. 9 is a schematic view showing a situation where a frit adhesive is filled in the first via-hole structure according to one embodiment of the present disclosure.

As shown in FIG. 8, in some embodiments of the present disclosure, the plurality of fanout lines 221 is arranged between the first gate insulation layer GI1 and the interlayer dielectric layer ILD.

As shown in FIG. 8, in some embodiments of the present disclosure, the plurality of fanout lines 221 is arranged between the first gate insulation layer GI1 and the second gate insulation layer GI2.

Illustratively, the plurality of fanout lines 211 is made of the first gate metal layer, i.e., the plurality of fanout lines 211 is arranged at a same layer, and made of a same material, as the gate electrode of the transistor. In this way, the plurality of fanout lines 221 and the gate electrode of the transistor are formed through a single patterning process, so it is able to simplify a manufacture process of the display substrate, and reduce the manufacture cost.

In some embodiments of the present disclosure, the plurality of fanout lines includes a plurality of first fanout lines and a plurality of second fanout lines, the plurality of first fanout lines is arranged between the first gate insulation layer GI1 and the second gate insulation layer GI2, the plurality of second fanout lines is arranged between the second gate insulation layer GI2 and the interlayer dielectric layer ILD, and each of the plurality of first fanout lines and the plurality of second fanout lines includes the first reuse portion 220.

Illustratively, the plurality of first fanout lines is made of the first gate metal layer, and the plurality of second fanout lines is made of the second gate metal layer. In this way, it is able to form the plurality of first fanout lines and the gate electrode of the transistor through a single patterning process, and form the plurality of second fanout lines and the electrode plate of the capacitor through a single patterning process, thereby to simplify the manufacture process of the display substrate in a better manner, and reduce the manufacture cost of the di splay substrate.

Illustratively, orthogonal projections of the first fanout lines onto the base substrate and orthogonal projections of the second fanout lines onto the base substrate are arranged alternately in the first direction. For each first fanout line and a corresponding second fanout line adjacent to the first fanout line, the orthogonal projection of the first fanout line onto the base substrate at least partially overlaps the orthogonal projection of the second fanout line onto the base substrate. Alternatively, for each first fanout line and a corresponding second fanout line adjacent to the first fanout line, the orthogonal projection of the first fanout line onto the base substrate is spaced apart from the orthogonal projection of the second fanout line onto the base substrate by a spacing region, and the orthogonal projections of at least a part of the first via-holes 230 onto the base substrate are located at the spacing region.

In the display substrate according to the embodiments of the present disclosure, when the plurality of fanout lines 221 include the plurality of first fanout lines and the plurality of second fanout lines, it is able to effectively reduce a distance between the adjacent fanout lines 221, thereby to reduce a height of the fanout layer 221 in the second direction.

As shown in FIG. 8, in some embodiments of the present disclosure, at least a part of the encapsulation base layer (e.g., 210) is arranged between the first gate insulation layer GI1 and the second gate insulation layer GI2.

Illustratively, at least a part of the encapsulation base layer is made of the first gate metal layer. In this way, at least a part of the encapsulation base layer and the other functional layer made of the first gate metal layer are formed through a single patterning process, so as to simplify the manufacture process of the display substrate in a better manner, and reduce the manufacture cost of the display substrate.

As shown in FIGS. 2, 3, 12 and 13, in some embodiments of the present disclosure, the display substrate further includes a first power source line and a second power source line arranged at the non-display region 2. The first power source line includes a transmission portion 240 and two first line inlet portions 241, the transmission portion 240 extends in a first direction, at least a part of the second line inlet portion 241 extends in a second direction, two ends of the transmission portion 240 are coupled to the two first line inlet portions 241 respectively, the transmission portion 240 is arranged between the display region 1 and the first line inlet portion 241, and the first direction intersects the second direction. The second power source line includes a peripheral portion 250 and two second line inlet portions 251, the peripheral portion 250 surrounds the display region 1 and is provided with an opening, two ends of the peripheral portion 250 at the opening are coupled to the two second line inlet portions 251 in a one-to-one manner, and at least a part of the second line inlet portion 251 extends in the second direction. The orthogonal projections of two first line inlet portions 241 onto the base substrate are located between orthogonal projections of the two second line inlet portions 251 onto the base substrate.

Illustratively, the first power source line includes a positive power source signal line VDD, and the second power source line includes a negative power source signal line VSS. The first power source line is coupled to a positive power source line at the display region 1, and configured to provide a VDD signal to the positive power source line at the display region 1. The second power source line is coupled to the cathode of the display substrate, and configured to provide a VSS signal to the cathode.

Illustratively, the first direction includes a horizontal direction, and the second direction includes a longitudinal direction.

Illustratively, the first power source line includes the transmission portion 240 and the two first line inlet portions 241. The transmission portion 240 includes a strip-like structure, and extends in the first direction. Two ends of the transmission portion 240 extend to two corner regions of the display substrate opposite to each other in the first direction respectively. An opening is formed in the transmission portion 240 and/or the first line inlet portion 241.

Illustratively, at least a part of the first line inlet portion 241 extends in the second direction, and the first line inlet portion 241 is coupled to one end of the transmission portion 240 and the driving integrated circuit of the display substrate.

Illustratively, the transmission portion 240 is formed integrally with the first line inlet portion 241. The transmission portion 240 and the first line inlet portion 241 are made of the first source-drain metal layer.

Illustratively, the peripheral portion 250 extends along a left frame, an upper frame and a lower frame of the display substrate, and is provided with an opening at the lower frame of the display substrate.

Illustratively, at least a part of the second line inlet portion 251 extends in the second direction, and the second line inlet portion 251 is coupled to a corresponding end of the peripheral portion 250 and the driving integrated circuit of the display substrate.

Illustratively, the peripheral portion 250 is formed integrally with the second line inlet portion 251, and the peripheral portion 250 and the second line inlet portion 251 are made of the first source-drain metal layer.

Illustratively, an orthogonal projection of the transmission portion 240 onto the base substrate and the orthogonal projections of the two first line inlet portions 241 onto the base substrate are arranged between the orthogonal projections of the two second line inlet portions 251 onto the base substrate.

As shown in FIGS. 2, 3, 12 and 13, in some embodiments of the present disclosure, the non-display region 2 includes two corner regions arranged in the first direction and corresponding to the two second line inlet portions 251 in a one-to-one manner, and at least a part of the second line inlet portion 251 is arranged at a corresponding corner region.

Illustratively, the two corner regions includes a corner region arranged at a lower left corner of the display substrate and a corner region arranged at a lower right corner of the display substrate.

Illustratively, the two first line inlet portions 241 correspond to the two corner regions respectively, and at least a part of the first line inlet portion 241 is arranged at a corresponding corner region.

As shown in FIGS. 2, 3, 12 and 13, in some embodiments of the present disclosure, the first line inlet portion 241 includes a second reuse portion 2410, an orthogonal projection of the second reuse portion 2410 onto the base substrate at least partially overlaps an orthogonal projection of a second target region of the encapsulation adhesive region 20 onto the base substrate, and the second reuse portion 2410 is reused as the encapsulation base layer at the second target region.

Illustratively, the encapsulation adhesive region 20 includes the second target region, and the orthogonal projection of the second reuse portion 2410 onto the base substrate is located within the orthogonal projection of the second target region of the encapsulation adhesive region 20 onto the base substrate. The second reuse portion 2410 is reused as the encapsulation base layer at the second target region, i.e., it is unnecessary to provide a dedicated encapsulation base layer at the second target region.

In the display substrate according to the embodiments of the present disclosure, the second reuse portion 2410 is reused as the encapsulation base layer at the second target region, so as to prevent the formation of a large-size encapsulation base layer, thereby to reduce the manufacture cost of the display substrate.

As shown in FIGS. 2, 3, 12 and 13, in some embodiments of the present disclosure, the second line inlet portion 251 includes a third reuse portion 2510, an orthogonal projection of the third reuse portion 2510 onto the base substrate at least partially overlaps an orthogonal projection of a third target region of the encapsulation adhesive region 20 onto the base substrate, and the third reuse portion 2510 is reused as the encapsulation base layer at the third target region.

Illustratively, the encapsulation adhesive region 20 includes the third target region, and the orthogonal projection of the third reuse portion 2510 onto the base substrate is located within the orthogonal projection of the third target region of the encapsulation adhesive region 20 onto the base substrate. The third reuse portion 2510 is reused as the encapsulation base layer at the third target region, i.e., it is unnecessary to provide a dedicated encapsulation base layer at the third target region.

In the display substrate according to the embodiments of the present disclosure, the third reuse portion 2510 is reused as the encapsulation base layer at the third target region, so as to prevent the formation of a large-size encapsulation base layer, thereby to reduce the manufacture cost of the display substrate.

Figure 12:
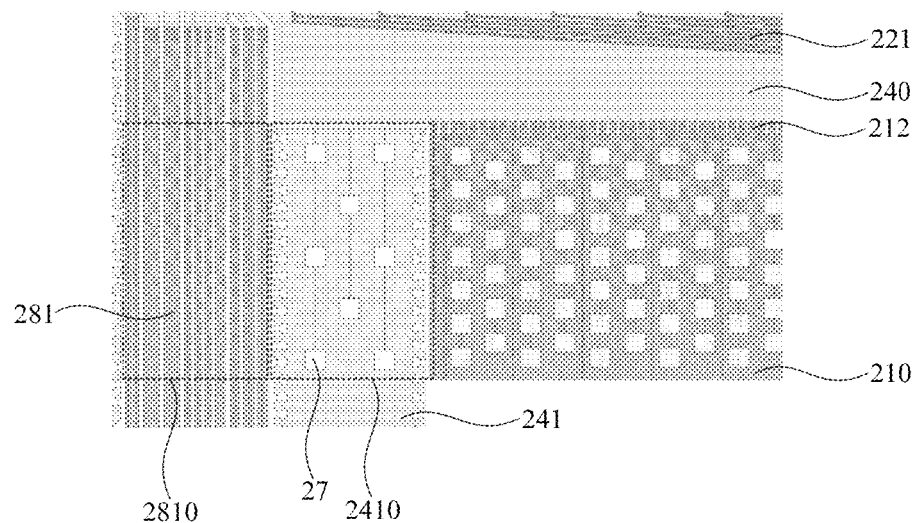
FIG. 12 is an enlarged view of B in FIG. 3.
Figure 13:
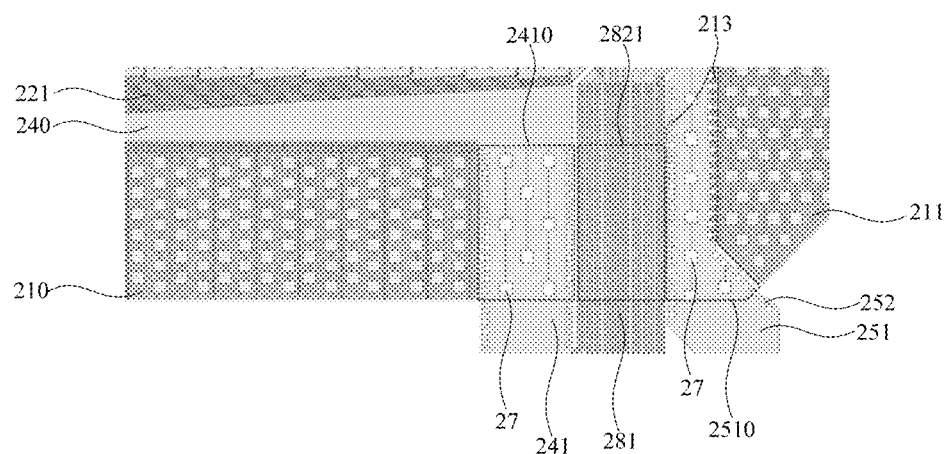
FIG. 13 is an enlarged view of C in FIG. 3.
Figure 14:
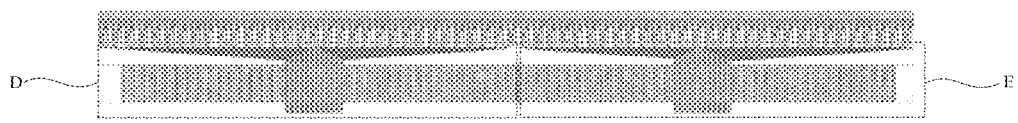
FIG. 14 is a schematic view showing a fanout layer and the first encapsulation portion according to one embodiment of the present disclosure.
Figure 15:
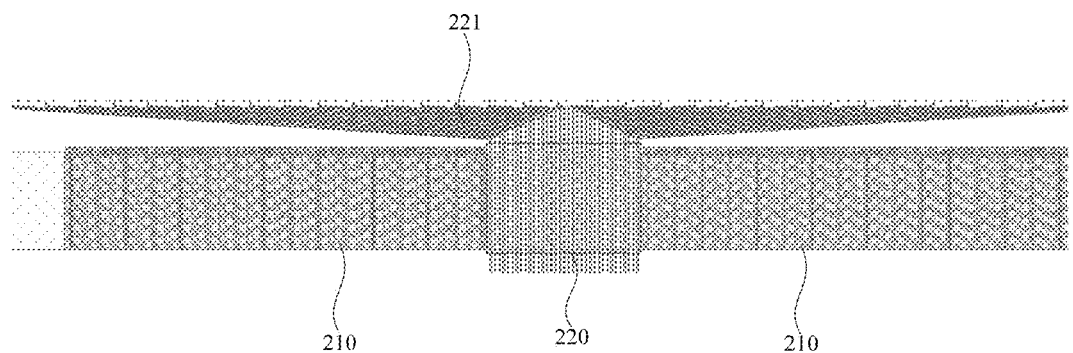
FIG. 15 is an enlarged view of D in FIG. 14.

As shown in FIGS. 12 and 13, in some embodiments of the present disclosure, a plurality of second via-holes 27 is formed in the second reuse portion 2410 and/or the third reuse portion 2510.

Illustratively, the plurality of second via-holes 27 is arranged evenly in the second reuse portion 2410 and/or the third reuse portion 2510.

In the display substrate according to the embodiments of the present disclosure, when the plurality of second via-holes 27 is formed in the second reuse portion 2410 and/or the third reuse portion 2510, it is able to effectively increase a contact area between the frit adhesive and the second reuse portion 2410 and/or the third reuse portion 2510, and improve the adhesion performance between the frit adhesive and the display substrate, thereby to improve the encapsulation capability, improve the resistance to moisture and oxygen, and achieve a better sealing effect.

Figure 3:
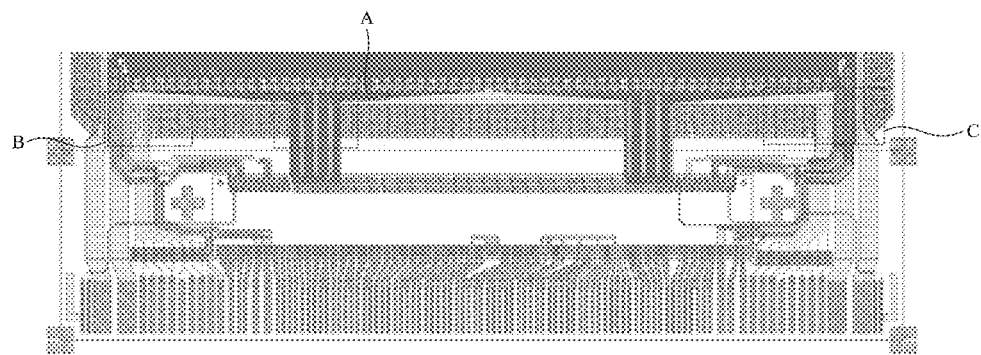
FIG. 3 is a schematic view showing a lower frame of the display substrate according to one embodiment of the present disclosure.

As shown in FIGS. 3, 12 and 13, in some embodiments of the present disclosure, the display substrate further includes: a gate driving circuit arranged at two opposite sides of the display region 1 in the first direction; and a plurality of first signal lines 281 arranged at a same side of the display region 1 as the first power source line, coupled to the gate driving circuit, and configured to provide a corresponding signal to the gate driving circuit. The first signal line 281 includes a fourth reuse portion 2821, an orthogonal projection of the fourth reuse portion 2821 onto the base substrate at least partially overlaps an orthogonal projection of a fourth target region of the encapsulation adhesive region 20 onto the base substrate, and the fourth reuse portion 2821 is reused as the encapsulation base layer at the fourth target region.

Illustratively, the display substrate further includes a gate driving circuit GOA configured to provide a corresponding scanning signal to the display substrate.

There exist various first signal lines 281. For example, the plurality of first signal lines 281 includes a frame start signal line, a clock signal line, a first level signal line, a second level signal line, etc. The gate driving circuit GOA is arranged at a left side and a right side of the display region 1, and each first signal line 281 is electrically coupled to the gate driving circuit GOA and the driving integrated circuit of the display substrate.

Illustratively, at least a part of the first signal line 281 is arranged at a same side of the display region 1 as the first power source line.

Illustratively, the orthogonal projection of the fourth reuse portion 2821 onto the base substrate is located between the orthogonal projection of an first line inlet portion 241 onto the base substrate and the orthogonal projection of the second line inlet portion 251 adjacent to the first line inlet portion 241 onto the base substrate.

Illustratively, the encapsulation adhesive region 20 includes the fourth target region, and the orthogonal projection of the fourth reuse portion 2821 onto the base substrate is located within the orthogonal projection of the fourth target region of the encapsulation adhesive region 20 onto the base substrate. The fourth reuse portion 2821 is reused as the encapsulation base layer at the fourth target region, i.e., it is unnecessary to provide a dedicated encapsulation base layer at the fourth target region.

In the display substrate according to the embodiments of the present disclosure, the fourth reuse portion 2821 is reused as the encapsulation base layer at the fourth target region, so as to prevent the formation of a large-size encapsulation base layer, thereby to reduce the manufacture cost of the display substrate.

Figure 2:
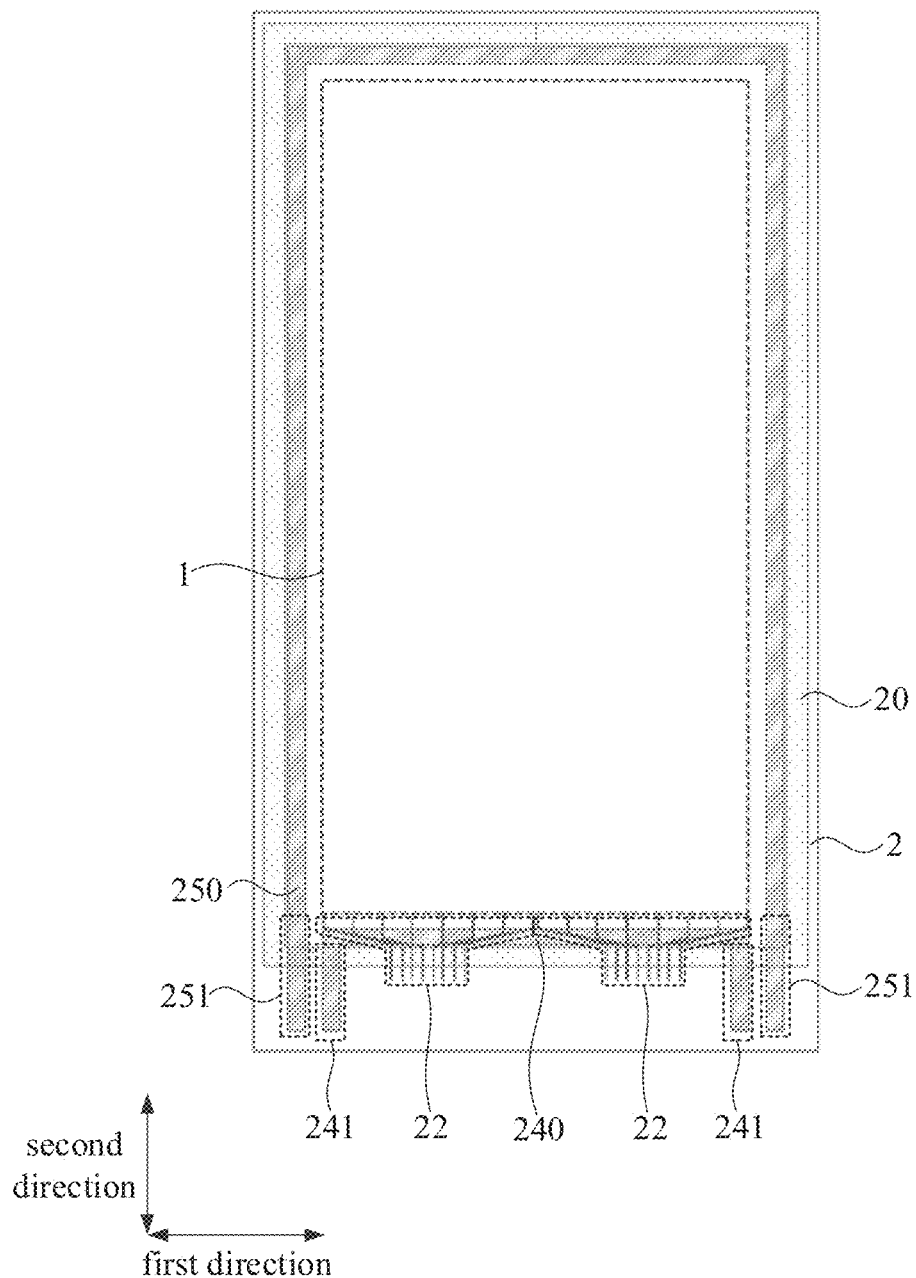
FIG. 2 is a schematic view showing an entire structure of the display substrate according to one embodiment of the present disclosure.
Figure 16:
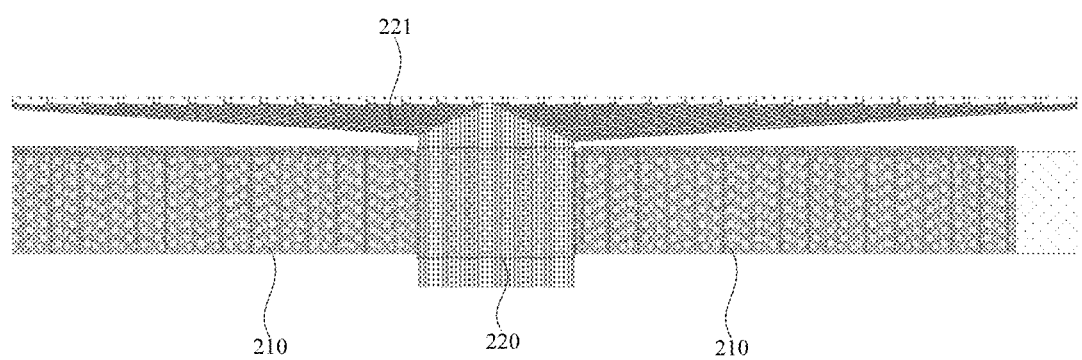
FIG. 16 is an enlarged view of E in FIG. 14.

As shown in FIGS. 2, 13 and 16, in some embodiments of the present disclosure, the encapsulation base layer includes: at least two first encapsulation portions 210, an orthogonal projection of each of at least two first encapsulation portions 210 onto the base substrate being arranged between orthogonal projections of the two first line inlet portions 241 onto the base substrate, the at least two first encapsulation portions 210 being arranged in the first direction, the first target region being provided between the adjacent first encapsulation portions 210; and a circular encapsulation portion 211 surrounding a side of the display region 1 other than another side where the first encapsulation portion 210 is located.

Illustratively, each first encapsulation portion 210 includes a strip-like pattern. The encapsulation base layer includes three first encapsulation portions 210 arranged in the first direction, and the first target region is provided between the adjacent first encapsulation portions 210, i.e., there are two first target regions. The fanout lines 221 are divided into two groups corresponding to the two first target regions respectively, each group of fanout lines 221 include the first reuse portion 220, and the first reuse portion 220 in each group of fanout lines 221 is reused as the encapsulation base layer at the corresponding first target region.

Illustratively, the circular encapsulation portion 211 surrounds an upper side, a left side and a right side of the display region 1.

In the display substrate according to the embodiments of the present disclosure, it is able to effectively reduce an area of the encapsulation base layer, thereby to reduce the manufacture cost of the display substrate.

As shown in FIGS. 12 and 13, in some embodiments of the present disclosure, the first encapsulation portion 210 is coupled to the first power source line, and the circular encapsulation portion 211 is coupled to the second power source line.

When the first encapsulation portion 210 is coupled to the first power source line, the first encapsulation portion 210 has a same stable potential as the first power source line. Identically, when the circular encapsulation portion 211 is coupled to the second power source line, the circular encapsulation portion 211 has a same stable potential as the second power source line. In this way, it is able to prevent the first power source line and the second power source line to be in a floating state, thereby to ensure the operation stability of the display substrate in a better manner.

In addition, when the first encapsulation portion 210 is coupled to the first power source line and the circular encapsulation portion 211 is coupled to the second power source line, it is equivalent to an increase in an area of each of the first power source line and the second power source line, so it is able to effectively reduce a voltage drop generated on each of the first power source line and the second power source line.

As shown in FIG. 12, in some embodiments of the present disclosure, the encapsulation base layer further includes a plurality of first conductive connection portions 212 formed integrally with the first encapsulation portion 210, and the first encapsulation portion 210 is coupled to the transmission portion 240 through the plurality of first conductive connection portions 212.

Illustratively, the plurality of first conductive connection portions 212 is arranged at intervals along a boundary of the first encapsulation portion 210.

When the plurality of first conductive connection portions 212 is formed integrally with the first encapsulation portion 210, it is able to form the plurality of first conductive connection portions 212 and the first encapsulation portion 210 through a single patterning process, thereby to simplify the manufacture process of the display substrate and reduce the manufacture cost of the display substrate.

When the first encapsulation portion 210 is coupled to the transmission portion 240 through the plurality of first conductive connection portions 212, it is able to ensure the connection performance between the first encapsulation portion 210 and the transmission portion 240 in a better manner.

As shown in FIG. 13, in some embodiments of the present disclosure, the encapsulation base layer further includes a plurality of second conductive connection portions 213 formed integrally with the circular encapsulation portion 211, a plurality of protrusions 252 is arranged at an edge of the peripheral portion 250 and/or the second line inlet portion 251, and the circular encapsulation portion 211 is coupled to at least a part of the protrusions 252 through the plurality of second conductive connection portions 213.

Illustratively, the plurality of second conductive connection portions 213 is arranged at intervals along a boundary of the circular encapsulation portion 211.

Illustratively, the plurality of protrusions 252 is formed integrally with the edge of the peripheral portion 250 and/or the second line inlet portion 251.

When the plurality of second conductive connection portions 213 is formed integrally with the circular encapsulation portion 211, it is able to form the plurality of second conductive connection portions 213 and the circular encapsulation portion 211 through a single patterning process, thereby to simplify the manufacture process of the display substrate and reduce the manufacture cost thereof.

When the circular encapsulation portion 211 is coupled to at least a part of the protrusions 252 through the plurality of second conductive connection portions 213, it is able to ensure the connection performance between the circular encapsulation portion 211 and the peripheral portion 250 and/or the second line inlet portion 251 in a better manner.

As shown in FIG. 4, in some embodiments of the present disclosure, a plurality of third via-holes 291 is formed in the first encapsulation portion 210 and/or the circular encapsulation portion 211. The display substrate further includes a plurality of groups of third secondary via-hole 292 corresponding to the plurality of third via-holes 291 in a one-to-one manner, each group of third secondary via-holes 292 include a plurality of third secondary via-holes 292, an orthogonal projection of the plurality of third secondary via-hole 292 onto the base substrate is located within an orthogonal projection of a corresponding third via-hole 291 onto the base substrate, and the third secondary via-hole 292 penetrates through at least one of the interlayer dielectric layer ILD, the second gate insulation layer GI2 and the first gate insulation layer GI1.

Illustratively, each of the third via-holes 291 and the third secondary via-holes 292 is a rectangular via-hole. The third via-hole 291 has a size of 40 µm*40 µm, and the third secondary via-hole 292 has a size of 6 µm*6 µm. In each group of third secondary via-holes 292, the plurality of third secondary via-holes 292 is arranged in an array form, and a distance between the adjacent secondary via-holes 292 is 3.5 μm.

Illustratively, after the formation of the display substrate and before the encapsulation, the buffer layer 80 of the display substrate is exposed through the third secondary via-holes 292. In this way, when the frit adhesive is formed subsequently, the frit adhesive is capable of permeating into the third secondary via-hole 292 so as to be in contact with the buffer layer 80. After a sintering process with laser, it is able to adhere the encapsulation cover plate with the display substrate firmly.

In addition, through the plurality of third via-holes 291 in the encapsulation base layer and the plurality of groups of third secondary via-holes 292, it is able to increase a contact area between the display substrate and the frit adhesive, thereby to improve an encapsulation effect of the display substrate.

In some embodiments of the present disclosure, the first via-hole has an aperture size smaller than that of the third via-hole.

Through this arrangement mode, it is able to not only provide more first via-holes, thereby to improve the encapsulation effect of the frit adhesive, but also prevent each first via-hole from overlapping the fanout line, thereby to reduce the manufacture difficulty of the first via-hole.

In some embodiments of the present disclosure, the display substrate includes a first gate insulation layer, a second gate insulation layer and an interlayer dielectric layer laminated one on another on the base substrate in a direction away from the base substrate, and the third secondary via-hole penetrates through the interlayer dielectric layer, the second gate insulation layer and the first gate insulation layer.

Through this arrangement mode, it is able to increase the contact area between the display substrate and the frit adhesive, thereby to improve the encapsulation effect of the display substrate.

The present disclosure further provides in some embodiments a display device including the above-mentioned display substrate.

According to the display substrate in the embodiments of the present disclosure, the encapsulation base layer is arranged at the encapsulation adhesive region 20, so as to improve a curing effect of the frit adhesive when encapsulating the display substrate. The first reuse portion 220 is reused as the encapsulation base layer at the first target region, so as to reduce an area of the encapsulation base layer and reduce the manufacture cost of the display substrate. In addition, the first via-hole structure 23 is arranged at the first target region, so that the surface of a part of the display substrate at the first target region away from the base substrate is uneven. In this way, when frit encapsulation is adopted for the display substrate, it is able to effectively increase a contact area between the frit adhesive and the display substrate, and improve the adhesion performance between the frit adhesive and the display substrate, thereby to improve an encapsulation capability, improve a resistance to moisture and oxygen, and achieve a better sealing effect.

Hence, when the display substrate includes the above-mentioned display substrate, it also has the above-mentioned beneficial effects, which will not be particularly defined herein.

It should be appreciated that, the display device is any product or member having a display function, e.g., television, display, digital photo frame, mobile phone or tablet computer.

In some embodiments of the present disclosure, the display device further includes an encapsulation cover plate arranged opposite to the display substrate, and the encapsulation cover plate and the display substrate are sealed through a sealant at the encapsulation adhesive region.

Illustratively, the sealant includes a frit adhesive.

When the display substrate is encapsulated through the frit adhesive and the encapsulation cover plate, a frit adhesive layer is formed at the encapsulation adhesive region 20 of the display substrate, then the encapsulation cover plate covers the display substrate, and then the frit adhesive is cured through a sintering process using laser, so as to encapsulate functional structures of the display substrate between the base substrate of the display substrate and the encapsulation cover plate.

The present disclosure further provides in some embodiments a method of manufacturing a display substrate. The display substrate includes a display region 1, and a non-display region 2 surrounding the display region 1 and including an encapsulation adhesive region 20 surrounding the display region. The method includes: forming an encapsulation base layer at the encapsulation adhesive region 20; and forming a fanout layer 22 at the non-display region 2, the fanout layer 22 including a first reuse portion 220. An orthogonal projection of the first reuse portion 220 onto a base substrate of the display substrate at least partially overlaps an orthogonal projection of a first target region of the encapsulation adhesive region 20 onto the base substrate, and the first reuse portion 220 is reused as the encapsulation base layer at the first target region.

Illustratively, the display substrate includes the display region 1 and the non-display region 2, the display region 1 is of a circular or rectangular shape, and the non-display region 2 completely surrounds the display region 1.

Illustratively, the encapsulation base layer includes a metal layer with excellent reflection performance, and surrounds the display region 1. The encapsulation base layer is arranged at a peripheral region of the non-display region 2 away from the display region 1, so as to surround the other functional structures at the non-display region 2 after the encapsulation.

Illustratively, the fanout layer 22 is arranged at a lower frame of the display substrate. The display substrate further includes a driving integrated circuit arranged at the non-display region 2, and the fanout layer 22 is coupled to a part of functional layers at the display region 1 and the driving integrated circuit, so as to achieve signal transmission between the part of functional layers and the driving integrated circuit.

Illustratively, the encapsulation adhesive region 20 includes the first target region, and the orthogonal projection of the first reuse portion 220 onto the base substrate of the display substrate is located within the orthogonal projection of the first target region of the encapsulation adhesive region 20 onto the base substrate. The first reuse portion 220 is reused as the encapsulation base layer at the first target region, i.e., it is unnecessary to provide a dedicated encapsulation base layer at the first target region.

The method includes forming a first via-hole structure 23 at the first target region, so that a surface of a part of the display substrate at the first target region away from the base substrate is uneven.

Illustratively, the first via-hole structure 23 includes a plurality of first via-holes 230 independent of each other and arranged at the first target region. The first via-hole 230 penetrates through at least a part of insulation layers at the first target region, so that the surface of a part of the display substrate at the first target region away from the base substrate is uneven.

In the display substrate manufacturing through the above-mentioned method, the encapsulation base layer is arranged at the encapsulation adhesive portion 20, so as to improve a curing effect of a frit adhesive during the encapsulation of the display substrate. In addition, the first reuse portion 220 is reused as the encapsulation base layer at the first target region, so as to prevent the formation of a large-size encapsulation base layer, thereby to reduce the manufacture cost of the display substrate.

In addition, in the display substrate manufacturing through the above-mentioned method, through the first via-hole structure 23 at the first target region, the surface of a part of the display substrate at the first target region away from the base substrate is uneven. In this way, when the frit encapsulation is adopted for the display substrate, it is able to effectively increase the contact area between the frit adhesive and the display substrate, and improve the adhesion performance between the frit adhesive and the display substrate, thereby to improve the encapsulation capability, improve the resistance to moisture and oxygen, and achieve a better sealing effect.

It should be appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

The invention claimed is:

1. A display substrate, comprising a display region, and a non-display region surrounding the display region and comprising an encapsulation adhesive region surrounding the display region, wherein the display substrate further comprises:
   an encapsulation base layer arranged at the encapsulation adhesive region; and
   a fanout layer arranged at the non-display region and comprising a first reuse portion,
   wherein an orthogonal projection of the first reuse portion onto a base substrate of the display substrate at least partially overlaps an orthogonal projection of a first target region of the encapsulation adhesive region onto the base substrate, and the first reuse portion is reused as the encapsulation base layer at the first target region;
   the display substrate further comprises a first power source line and a second power source line arranged at the non-display region,
   wherein the first power source line comprises a transmission portion and two first line inlet portions, the transmission portion extends in a first direction, at least a part of the second line inlet portion extends in a second direction, two ends of the transmission portion are coupled to the two first line inlet portions respectively, the transmission portion is arranged between the display region and the first line inlet portion, and the first direction intersects the second direction;
   the second power source line comprises a peripheral portion and two second line inlet portions, the peripheral portion surrounds the display region and is provided with an opening, two ends of the peripheral portion at the opening are coupled to the two second line inlet portions respectively, and at least a part of the second line inlet portion extends in the second direction; and
   an orthogonal projection of each of two first line inlet portions onto the base substrate is located between orthogonal projections of the two second line inlet portions onto the base substrate.

2. The display substrate according to claim 1, further comprising a first via-hole structure arranged at the first target region, so that a surface of a part of the display substrate at the first target region away from the base substrate is uneven.

3. The display substrate according to claim 2, further comprising at least two of a first gate insulation layer, a second gate insulation layer and an interlayer dielectric layer laminated one on another on the base substrate in a direction away from the base substrate,
   wherein the first via-hole structure comprises a plurality of first via-holes, and the first via-hole penetrates through at least one of the first gate insulation layer, the second gate insulation layer and the interlayer dielectric layer.

4. The display substrate according to claim 3, wherein the fanout layer comprises a plurality of fanout lines, the plurality of fanout lines comprises the first reuse portion, and an orthogonal projection of the fanout line onto the base substrate does not overlap an orthogonal projection of the first via-hole structure onto the base substrate.

5. The display substrate according to claim 4, wherein the plurality of first via-holes is divided into a plurality of via-hole groups, and orthogonal projections of the plurality of via-hole groups onto the base substrate and orthogonal projections of the plurality of fanout lines onto the base substrate are arranged alternately in a first direction.

6. The display substrate according to claim 4, wherein the plurality of fanout lines is arranged between the first gate insulation layer and the interlayer dielectric layer.

7. The display substrate according to claim 4, wherein the plurality of fanout lines comprises a plurality of first fanout lines and a plurality of second fanout lines, the plurality of first fanout lines is arranged between the first gate insulation layer and the second gate insulation layer, the plurality of second fanout lines is arranged between the second gate insulation layer and the interlayer dielectric layer, and
 each of the plurality of first fanout lines and the plurality of second fanout lines comprises the first reuse portion.

8. The display substrate according to claim 3, wherein at least a part of the encapsulation base layer is arranged between the first gate insulation layer and the second gate insulation layer.

9. The display substrate according to claim 1, wherein the non-display region comprises two corner regions arranged in the first direction and corresponding to the two second line inlet portions respectively, and at least a part of the second line inlet portion is arranged at a corresponding corner region.

10. The display substrate according to claim 1, wherein each first line inlet portion comprises a second reuse portion, an orthogonal projection of the second reuse portion onto the base substrate at least partially overlaps an orthogonal projection of a second target region of the encapsulation adhesive region onto the base substrate, and the second reuse portion is reused as the encapsulation base layer at the second target region,
 wherein the second line inlet portion comprises a third reuse portion, an orthogonal projection of the third reuse portion onto the base substrate at least partially overlaps an orthogonal projection of a third target region of the encapsulation adhesive region onto the base substrate, and the third reuse portion is reused as the encapsulation base layer at the third target region,
 wherein a plurality of second via-holes is formed in the second reuse portion and/or the third reuse portion.

11. The display substrate according to claim 1, further comprising:
 a gate driving circuit arranged at two opposite sides of the display region in the first direction; and
 a plurality of first signal lines arranged at a same side of the display region as the first power source line, coupled to the gate driving circuit, and configured to provide a corresponding signal to the gate driving circuit,
 wherein the first signal line comprises a fourth reuse portion, an orthogonal projection of the fourth reuse portion onto the base substrate at least partially overlaps an orthogonal projection of a fourth target region of the encapsulation adhesive region onto the base substrate, and the fourth reuse portion is reused as the encapsulation base layer at the fourth target region.

12. The display substrate according to claim 1, wherein the encapsulation base layer comprises:
 at least two first encapsulation portions, an orthogonal projection of the at least two first encapsulation portions onto the base substrate being arranged between orthogonal projections of the two first line inlet portions onto the base substrate, the at least two first encapsulation portions being arranged in the first direction, the first target region being provided between the adjacent first encapsulation portions; and
 a circular encapsulation portion surrounding a side of the display region other than another side where the first encapsulation portion is located.

13. The display substrate according to claim 12, wherein the first encapsulation portion is coupled to the first power source line, and the circular encapsulation portion is coupled to the second power source line.

14. The display substrate according to claim 13, wherein the encapsulation base layer further comprises a plurality of first conductive connection portions formed integrally with the first encapsulation portion, and the first encapsulation portion is coupled to the transmission portion through the plurality of first conductive connection portions.

15. The display substrate according to claim 13, wherein the encapsulation base layer further comprises a plurality of second conductive connection portions formed integrally with the circular encapsulation portion,
 a plurality of protrusions is arranged at an edge of the peripheral portion and/or the second line inlet portion, and the circular encapsulation portion is coupled to at least a part of the protrusions through the plurality of second conductive connection portions.

16. The display substrate according to claim 12, wherein a plurality of third via-holes is formed in the first encapsulation portion and/or the circular encapsulation portion,
 the display substrate further comprises a plurality of groups of third secondary via-hole corresponding to the plurality of third via-holes in a one-to-one manner, each group of third secondary via-holes comprise a plurality of third secondary via-holes, an orthogonal projection of the plurality of third secondary via-holes onto the base substrate is located within an orthogonal projection of a corresponding third via-hole onto the base substrate, and the third secondary via-hole penetrates through at least one of the interlayer dielectric layer, the second gate insulation layer and the first gate insulation layer.

17. The display substrate according to claim 16, wherein the first via-hole has an aperture size smaller than that of the third via-hole; or
 the display substrate comprises a first gate insulation layer, a second gate insulation layer and an interlayer dielectric layer laminated one on another on the base substrate in a direction away from the base substrate, wherein the third secondary via-hole penetrates through the interlayer dielectric layer, the second gate insulation layer and the first gate insulation layer.

18. A display device, comprising the display substrate according to claim 1, and an encapsulation cover plate arranged opposite to the display substrate, wherein the encapsulation cover plate and the display substrate are sealed through a sealant at the encapsulation adhesive region.

19. A method of manufacturing a display substrate, the display substrate comprising a display region, and a non-display region surrounding the display region and comprising an encapsulation adhesive region surrounding the display region, the method comprising:
 forming an encapsulation base layer at the encapsulation adhesive region; and
 forming a fanout layer at the non-display region, the fanout layer comprising a first reuse portion,
 wherein an orthogonal projection of the first reuse portion onto a base substrate of the display substrate at least partially overlaps an orthogonal projection of a first target region of the encapsulation adhesive region onto the base substrate, and the first reuse portion is reused as the encapsulation base layer at the first target region;

wherein the display substrate further comprises a first power source line and a second power source line arranged at the non-display region, wherein the first power source line comprises a transmission portion and two first line inlet portions, the transmission portion extends in a first direction, at least a part of the second line inlet portion extends in a second direction, two ends of the transmission portion are coupled to the two first line inlet portions respectively, the transmission portion is arranged between the display region and the first line inlet portion, and the first direction intersects the second direction;

the second power source line comprises a peripheral portion and two second line inlet portions, the peripheral portion surrounds the display region and is provided with an opening, two ends of the peripheral portion at the opening are coupled to the two second line inlet portions respectively, and at least a part of the second line inlet portion extends in the second direction; and an orthogonal projection of each of two first line inlet portions onto the base substrate is located between orthogonal projections of the two second line inlet portions onto the base substrate.

\* \* \* \* \*